(12) United States Patent
Agizim et al.

(10) Patent No.: US 6,476,747 B1
(45) Date of Patent: Nov. 5, 2002

(54) DIGITAL TO ANALOG CONVERTER

(75) Inventors: Aharon M. Agizim; David Rouchbach, both of Netanya; Zadok Rachamim, Elad, all of (IL)

(73) Assignee: ADC Telecommunications Israel Ltd., Herzliya (IL)

( * ) Notice: Subject to any disclaimer, the term of this patent is extended or adjusted under 35 U.S.C. 154(b) by 3 days.

(21) Appl. No.: 09/829,554

(22) Filed: Apr. 10, 2001

(51) Int. Cl.[7] .................................................. H03M 1/66
(52) U.S. Cl. ....................... 341/144; 341/152; 375/238; 332/109; 327/172; 327/175
(58) Field of Search .......................... 332/109; 341/144, 341/152; 375/238; 327/172, 175

(56) References Cited

U.S. PATENT DOCUMENTS

| | | | | | |
|---|---|---|---|---|---|
| 3,789,393 | A | * | 1/1974 | Tripp | 318/599 |
| 4,542,371 | A | * | 9/1985 | Uchikoshi | 327/100 |
| 4,739,304 | A | * | 4/1988 | Takeda et al. | 341/144 |
| 4,851,844 | A | * | 7/1989 | Akagiri | 341/144 |
| 5,789,992 | A | * | 8/1998 | Moon | 332/109 |

* cited by examiner

*Primary Examiner*—Michael Tokar
*Assistant Examiner*—Khai Nguyen
(74) *Attorney, Agent, or Firm*—Fogg and Associates; Laura A. Ryan

(57) ABSTRACT

A digital to analog converter is provided. The converter includes a multi-bit counter, a first and a second plurality of logic gates coupled to the multi-bit counter, a digital input selectively coupled to the first and second plurality of logic gates. The converter further includes a first AND gate coupled to an output of the first plurality of logic gates and a second AND gate coupled to an output of the second plurality of logic gates. In addition, the converter includes a clock coupled to an input of the first and second AND gates and an input of the multi-bit counter and a filter coupled to an output of the first and second AND gates, wherein the filter includes an output for an analog signal based on the digital input.

55 Claims, 9 Drawing Sheets

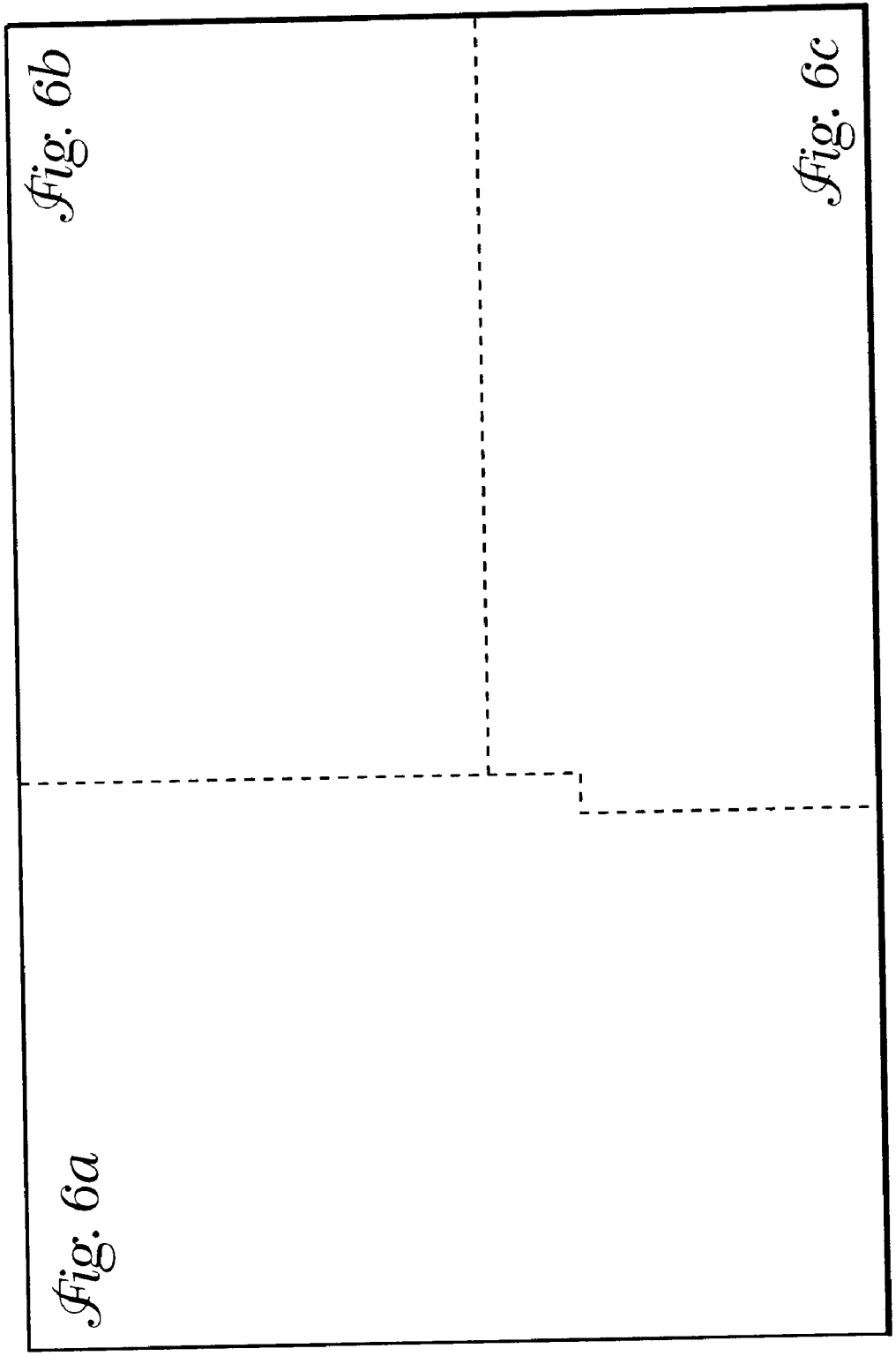

DIGITAL TO ANALOG CONVERTER

TECHNICAL FIELD

The present invention relates generally to the field of electronic circuits and in particular to digital to analog converters.

BACKGROUND

Digital to analog converters (DACs) are well known and are used to convert digital signals representing information into analog signals representing the same information. Traditionally when converting bits of a word to an analog signal at least one resistor is needed for conversion of each bit of the word. As a result conventional current summing digital to analog converters become more and more difficult to manufacture using chip technology as the number of bits per word increases.

When designing circuits space is at a premium. As a result, the space used for digital to analog converters should be carefully controlled. In some systems, both analog and digital signals are used. In such "mixed-mode" systems, digital to analog (D/A) and/or analog to digital (A/D) converters are used in the circuit to allow the mixed-mode system on a single chip. In addition to space requirements, other issues such as problems with wiring and routing are often found when utilizing discrete components. In addition, the cost of manufacturing units having discrete components as compared to chip technology is high. Further, the number of possible error locations also increases with discrete components as compared with a single chip. Even when employing separate chips for the D/A and the A/D converters has the drawback of requiring an interface between the chips. Some existing DACs use pulse width modulation to generate a proportional analog output. Unfortunately, these DACs often introduce a significant amount of low frequency noise into the analog signals.

For the reasons stated above, and for other reasons stated below which will become apparent to those skilled in the art upon reading and understanding the present specification, there is a need in the art for improvements in digital to analog converters.

SUMMARY

The above mentioned problems with digital to analog converters in current chip technology and other problems are addressed by embodiments of the present invention and will be understood by reading and studying the following specification.

In one embodiment, a digital to analog converter is provided. The converter includes a multi-bit counter and a first and a second plurality of logic gates coupled to the multi-bit counter. The converter further includes a digital input selectively coupled to the first and second plurality of logic gates a first AND gate coupled to an output of the first plurality of logic gates and a second AND gate coupled to an output of the second plurality of logic gates. In addition, the converter includes a clock coupled to an input of the first and second AND gates and a filter coupled to an output of the first and second AND gates. The filter includes an output for an analog signal based on the digital input.

In another embodiment, a method of converting a multi-bit digital input signal to an analog signal is provided. The method includes receiving a digital number and converting the digital number to a series of pulses. The method further includes summing the series of pulses. The pulses in a predetermined period represent the received digital number. In addition, the method includes applying a clock signal to the sum of the series of pulses to obtain an analog signal that represents the digital number.

DETAILED DESCRIPTION

In the following detailed description, reference is made to the accompanying drawings that form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

Figure 1:
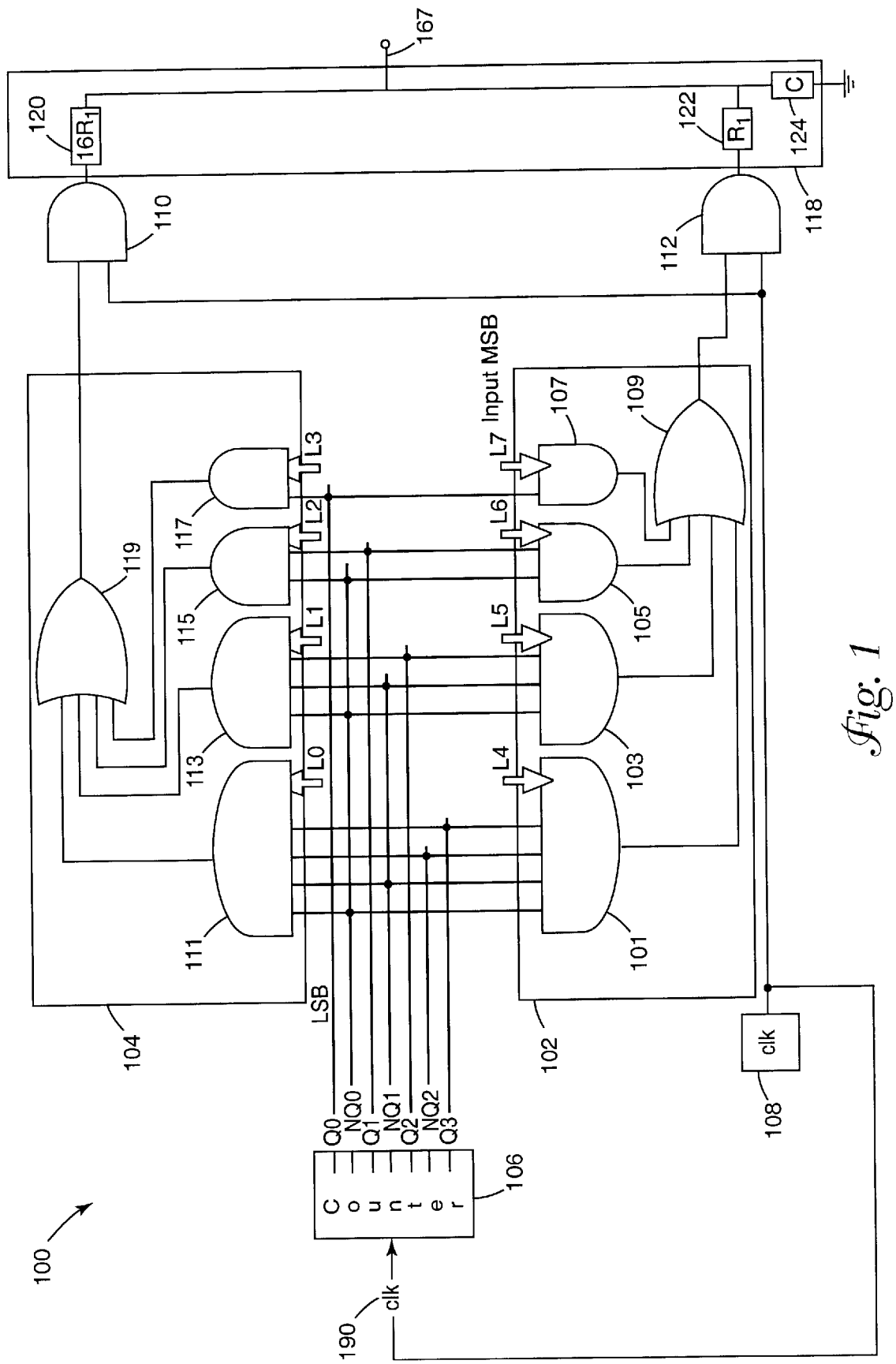
FIG. 1 is a block diagram of an embodiment of a digital to analog converter according to the teachings of this invention.

FIG. 1 is an illustration of one embodiment of a digital to analog converter (DAC) indicated generally at 100 and constructed according to the teachings of the present invention. DAC 100 generates a train of pulses that are substantially spread over a time interval with the number of pulses based on the digital input number that is being converted to an analog representation. The time interval is affected by a clock input that aids in converting low frequency harmonics to high frequency. The high frequency harmonics are then easily filtered out using a simple low pass filter.

Converter 100 includes a counter 106 that is coupled to a first and a second plurality of logic gates 102 and 104, respectively. In one embodiment, counter 106 is a 4-bit counter. In one embodiment, counter 106 includes clock input 190 (CLK). In one embodiment, counter 106 includes seven separate outputs Q0 to Q3 and NQ0 to NQ2 wherein the NQ outputs are the inverse of the corresponding Q output. For example when Q0 is 1 then NQ0 is 0 and vice versa. In another embodiment, counter 106 is a 4-bit counter representing Q0 to Q3 and includes three inverters to convert Q0 to Q2 to NQ0 to Q2.

The first plurality of logic gates 104 includes four AND gates 111, 113, 115 and 117 and one OR gate 119. OR gate 119 is coupled to the output of AND gates 111, 113, 115 and 117. The second plurality of logic gates 102 includes four AND gates 101, 103, 105 and 107 and one OR gate 109. OR gate 109 is coupled to the output of AND gates 101, 103, 105 and 107.

Each AND gate 111, 113, 115 and 117 of the first plurality of logic gates 104 and 101, 103, 105 and 107 of the second plurality of logic gates 102 produces pulses at a different frequency. Further, no pulses of the first plurality of logic gates 104 overlap in time and no pulses of the second plurality of logic gates 102 overlap in time. In one embodiment, each AND gate of the first or second plurality of logic gates 104 or 102 produces pulses with frequencies that are multiples of 2 of the other frequencies, e.g. the frequency of the output of AND gate 117 is twice the frequency of the output of AND gate 115 which is twice the frequency of AND gate 113 which is twice the frequency of AND gate 111. In one embodiment, based on the frequency of the clock (fclock) of counter 106 the frequency of the outputs of AND gates of the first or second plurality of logic gates 104 or 102 are equal to the following: $f_{AND117}$=fclock/2, $f_{AND115}$=fclock/4, $f_{AND113}$=fclock/8, $f_{AND111}$=fclock/16. Again, no pulses overlap in time due to the selection of inputs provided by counter 106. Since the pulses do not overlap in time the outputs of the AND gates, e.g., 111, 113, 115 and 117 can be summed with and OR logic gate such as 119.

The output of the first plurality of logic gates 104 is coupled to an input of AND gate 110. The output of the second plurality of logic gates 102 is coupled to an input of AND gate 112. A second input of AND gate 110 is coupled to a clock 108. A second input of AND gate 112 is also coupled to clock 108. The CLK input 190 of counter 106 is coupled to clock 108. The outputs of AND gates 110 and 112 are coupled to a filter 118. Filter 118 includes an output 167 for an analog signal based on a digital input signal via L0 to L7. In one embodiment, filter 118 is a low pass filter. In one embodiment, filter 118 comprises a first resistor 120 coupled to the output of AND gate 110 and a second resistor 122 coupled to the output of AND gate 112. Resistor 120 and 122 are coupled in parallel and are coupled in series with a capacitor 124. In one embodiment, resistor 120 is sixteen times the value of resistor 122, as further described below.

In operation, counter 106 counts between 0 and 15 on the output of Q0 to Q3, changing the state on each clock pulse coming from CLK input 190. The binary outputs of counter 106 are represented in Table 1 beginning with 0 (0000) and going up to 15 (1111). As counter 106 operates, information is input to the first and second plurality of logic gates 104 and 102 via inputs L0 to L7. L7 representing the most significant bit and L0 the least significant bit in an 8-bit word that is to be converted from a digital word to an analog output. The voltage measured on the output of converter 100 is proportional to the value input via L0 to L7. For example, if operating on a 0 to 5 volt scale to represent the output voltage each increment 0 to 255 received on the input L0 to L7 is represented by approximately 0.02 volts on the output.

TABLE 1

|    | Q3 | Q2 | Q1 | Q0 | NQ2 | NQ1 | NQ0 |
|----|----|----|----|----|----|----|----|
| 0  | 0 | 0 | 0 | 0 | 0 | 1 | 1 | 1 |
| 1  | 0 | 0 | 0 | 1 | 1 | 1 | 0 |
| 2  | 0 | 0 | 1 | 0 | 1 | 0 | 1 |
| 3  | 0 | 0 | 1 | 1 | 1 | 0 | 0 |
| 4  | 0 | 1 | 0 | 0 | 0 | 1 | 1 |

TABLE 1-continued

|    | Q3 | Q2 | Q1 | Q0 | NQ2 | NQ1 | NQ0 |
|----|----|----|----|----|----|----|----|
| 5  | 0 | 1 | 0 | 1 | 0 | 1 | 0 |
| 6  | 0 | 1 | 1 | 0 | 0 | 0 | 1 |
| 7  | 0 | 1 | 1 | 1 | 0 | 0 | 0 |
| 8  | 1 | 0 | 0 | 0 | 1 | 1 | 1 |
| 9  | 1 | 0 | 0 | 1 | 1 | 1 | 0 |
| 10 | 1 | 0 | 1 | 0 | 1 | 0 | 1 |
| 11 | 1 | 0 | 1 | 1 | 1 | 0 | 0 |
| 12 | 1 | 1 | 0 | 0 | 0 | 1 | 1 |
| 13 | 1 | 1 | 0 | 1 | 0 | 1 | 0 |
| 14 | 1 | 1 | 1 | 0 | 0 | 0 | 1 |
| 15 | 1 | 1 | 1 | 1 | 0 | 0 | 0 |

Figure 2:
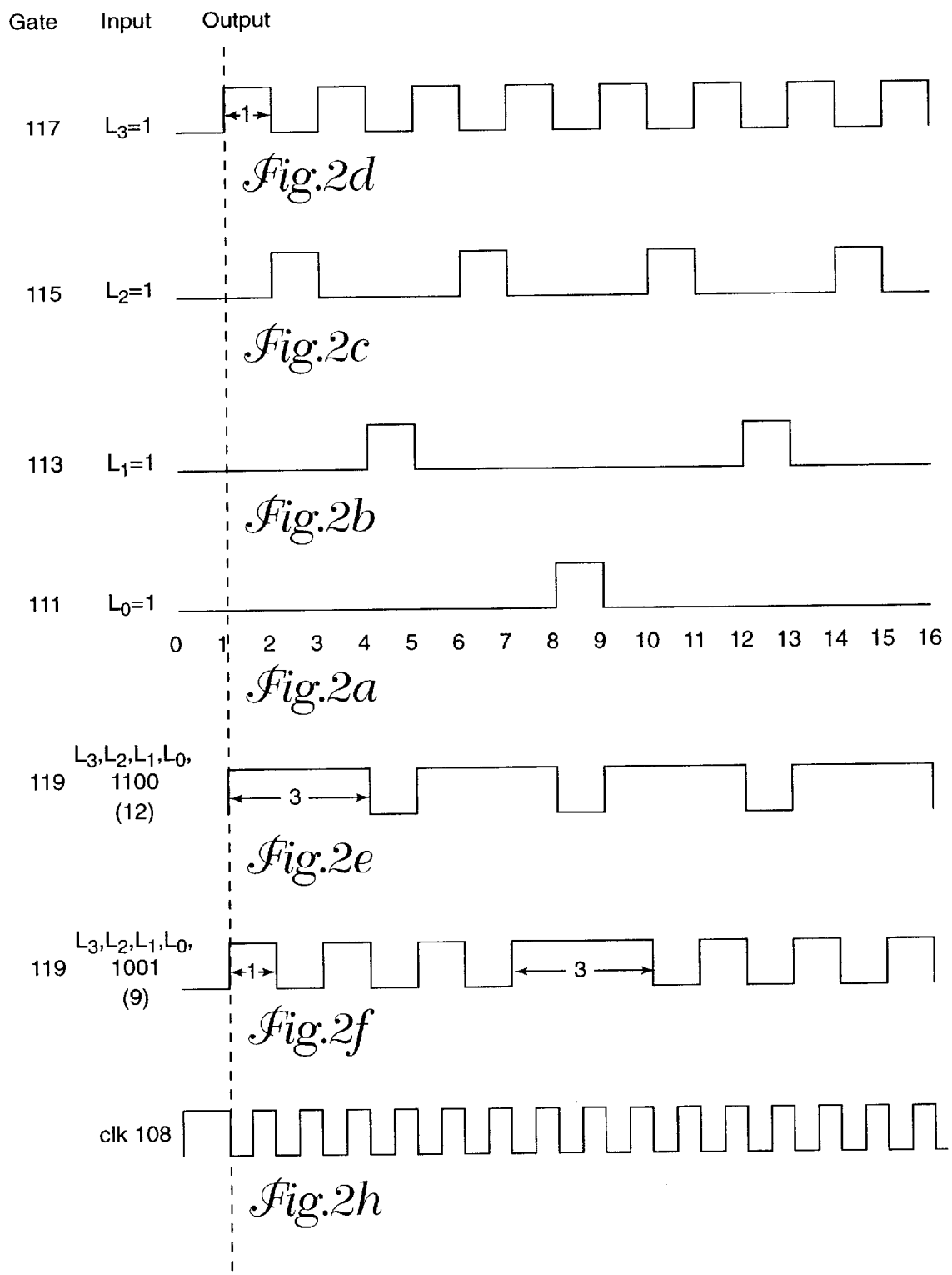
FIGS. 2a–f are graphs that illustrate an example of the resulting signal of one embodiment of a digital to analog converter constructed according to the teachings of this invention.
FIG. 2h is a graph that illustrates and example of a clock signal.

The first and the second plurality of logic gates 104 and 102 each perform pulse width modulation on the received input signals L0 to L3 and L4 to L7, respectively. By example, for an input of 15 wherein L0, L1, L2 and L3 are all high or 1's the output of AND gates 111, 113, 115, and 117 as counter 106 counts between 0 and 15 are graphically depicted in FIGS. 2a, 2b, 2c, and 2d, respectively. When L3 and L2 are high and L1 and L0 are low (1100) representing the number 12 the sum of pulse widths of the output of OR gate 119 sums to 12 pulse from AND gates 117 and 115. The output is graphically depicted in FIG. 2e. The total pulse width of the pulses shown adds to 12. When L3 and L0 are high and L1 and L2 are low (1001) representing the number 9 the sum of the pulse widths of the output of OR gate 119 sums to 9. The output is graphically depicted in FIG. 2f. The clock input 190 is graphically depicted in FIG. 2h.

The plurality of logic gates 104 operate on 4-bits L3L2L1L0 and the plurality of logic gates 102 operate on a second 4-bits L7L6L5L4. Digital to analog converter 106 is capable of converting up to an 8-bit word. The first and second plurality of logic gates 104 and 102 include the same hardware, four AND logic gates and 1 OR logic gate configured the same and receiving the corresponding inputs, Q0 to Q4 and NQ0 to NQ2 from counter 106. The first and second logic gates 104 and 102 differ in that they operate on different 4-bit inputs L0 to L3 and L4 to L7, respectively. The OR gates 119 and 109 of plurality of logic gates 104 and 102, respectively, each receives the outputs of their respective AND gates, adds the outputs together, and transmits the resulting sum to associated AND gates 110 and 112 respectively.

The outputs of AND gates 110 and 112 depend on the outputs of OR gates 119 and 109, respectively, and on the output of clock 108. The clock pulses of clock 108, acting on the other inputs of AND gates 110 and 112 prevent the outputs of AND gates 110 and 112 from depending on transient events which take place in counter 106 and in sets of logic gates 102 and 104. As a result, the low frequency noise from the transients is not allowed to reach analog output 167.

The outputs of AND gate 111 for the least significant bit L0 of the 4-bit input L3L2L1L0 is the same as the output of AND gate 101 for the least significant bit L4 of the 4-bit input L7L6L5L4 when L0 and L4 are both high or both low. In order to represent an analog output which corresponds to the 8-bit digital input (L7L6L5L4L3L2L1L0) the voltage output for the plurality of logic gates 102 has to be increased by a proportional amount or the voltage output for the plurality of logic gates 104 has to be decreased by a proportional amount. Each bit L0 to L7 represents a number twice as large as the next higher bit. For example if L0 represents 1 then, L1 represents 2L0 (2), L2 represents 2L1

(4) or 4L0, L3 represents 2L2 (8) or 8L0, L4 represents 2L3 (16) or 16L0, L5 represents 2L4 (32) or 32L0, L6 represents 2L5(64) or 64L0 and L7 represents 2L6 (128) or 128 L0. In one embodiment, in order to represent the output of the second plurality of logic gates 102 in relationship to the output of the first plurality of logic gates 104, each bit of 4-bit input L3L2L1L0 can be represented with respect to each bit of the 4-bit input L7L6L5L4 as follows:

16L3=L7
16L2=L6
16L1=L5
16L0=L4

Resistors 120 and 122 are sized to compensate for this difference in value. For example, the value for 122 is $1/16^{th}$ of the value for resistor 120. Thus the same clock can be use for each of logic circuits 102 and 104. Advantageously, an 8-bit output is produced using only a 4-bit clock counter 106 during 16 clock periods.

In one embodiment, AND gates 110 and 112 each receive two inputs. One input from their respective plurality of logic gates 104 and 102 and another from a common clock 108. AND gate 110 takes an output such as that depicted in FIG. 2e, and produces an output to resistor 120 based on clock 108. As the same clock 108 affects the counter 106 simultaneously with AND gates 110 and 112, the shape of the pulses coming out of AND gates 110 and 112 do not depend on various transients. As a result output pulses of AND gates 110 and 112 are of the same shape.

Figure 3:
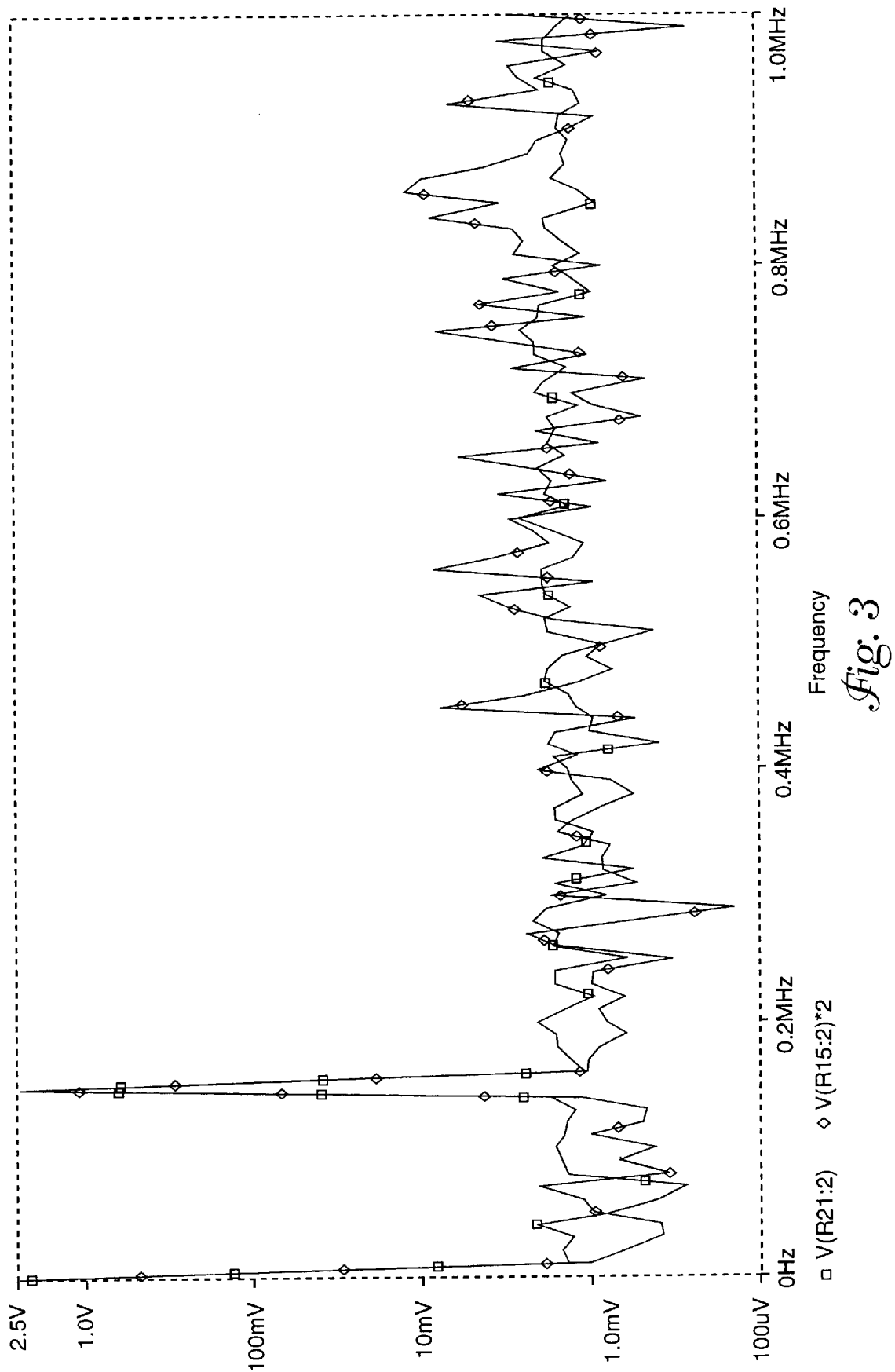
FIG. 3 is a graph that illustrates an example of an analog output signal of one embodiment of a digital to analog converter constructed according to the teachings of this invention.
Figure 4:
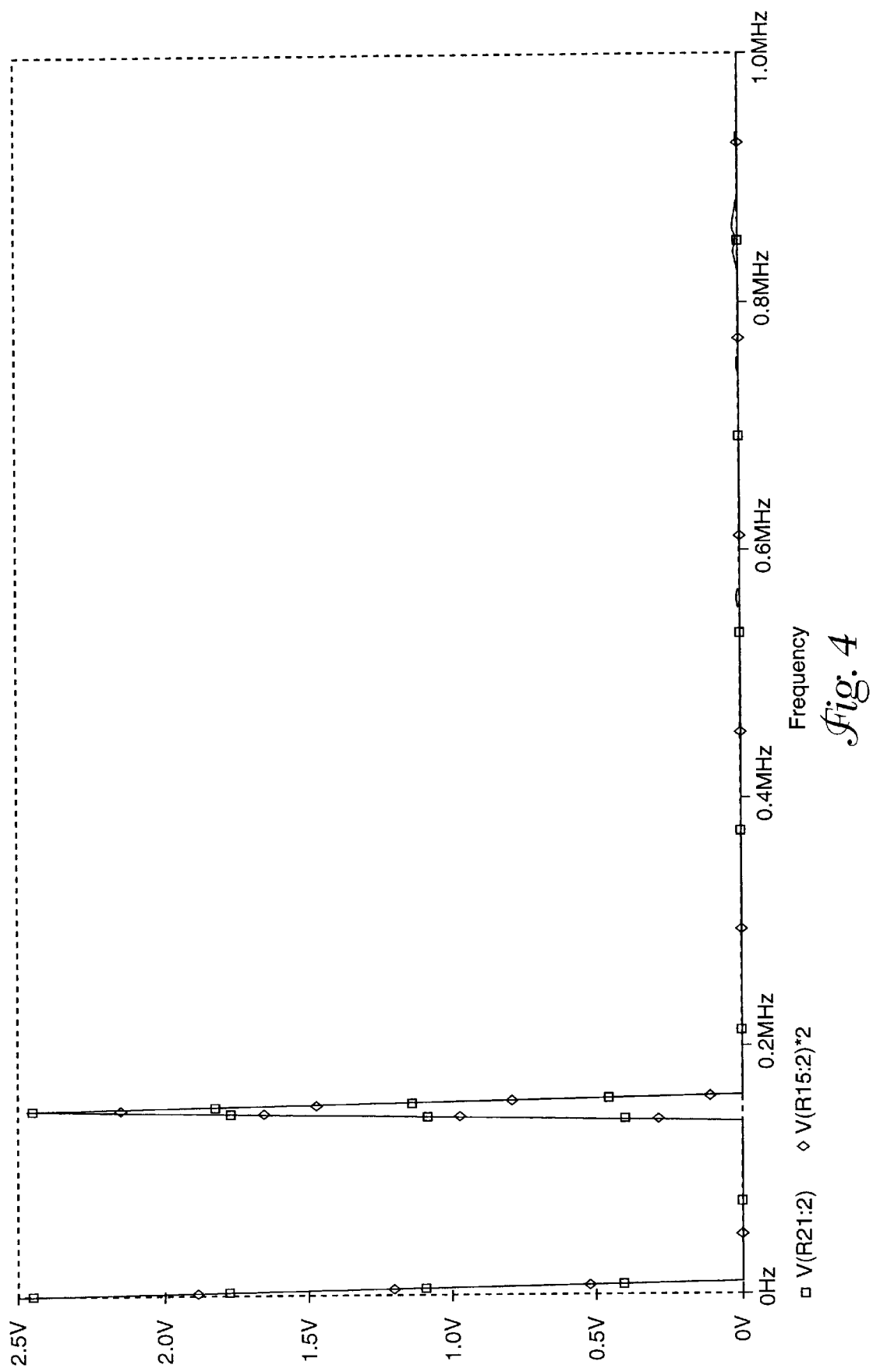
FIG. 4 is a graph that illustrates an example of a filtered analog output signal of one embodiment of a digital to analog converter constructed according to the teachings of this invention.

By example the graph marked by diamonds of FIG. 3 is a graph that illustrates the log power spectrum of the analog output 167 based on a representative digital input. The graph includes high frequency harmonics that are then filtered out by a low pass filter such as 118. The resultant output is illustrated by the graph marked by diamonds of FIG. 4 where the high frequency signals have been filtered out leaving only the analog output signal having good spectral purity.

Figure 5:
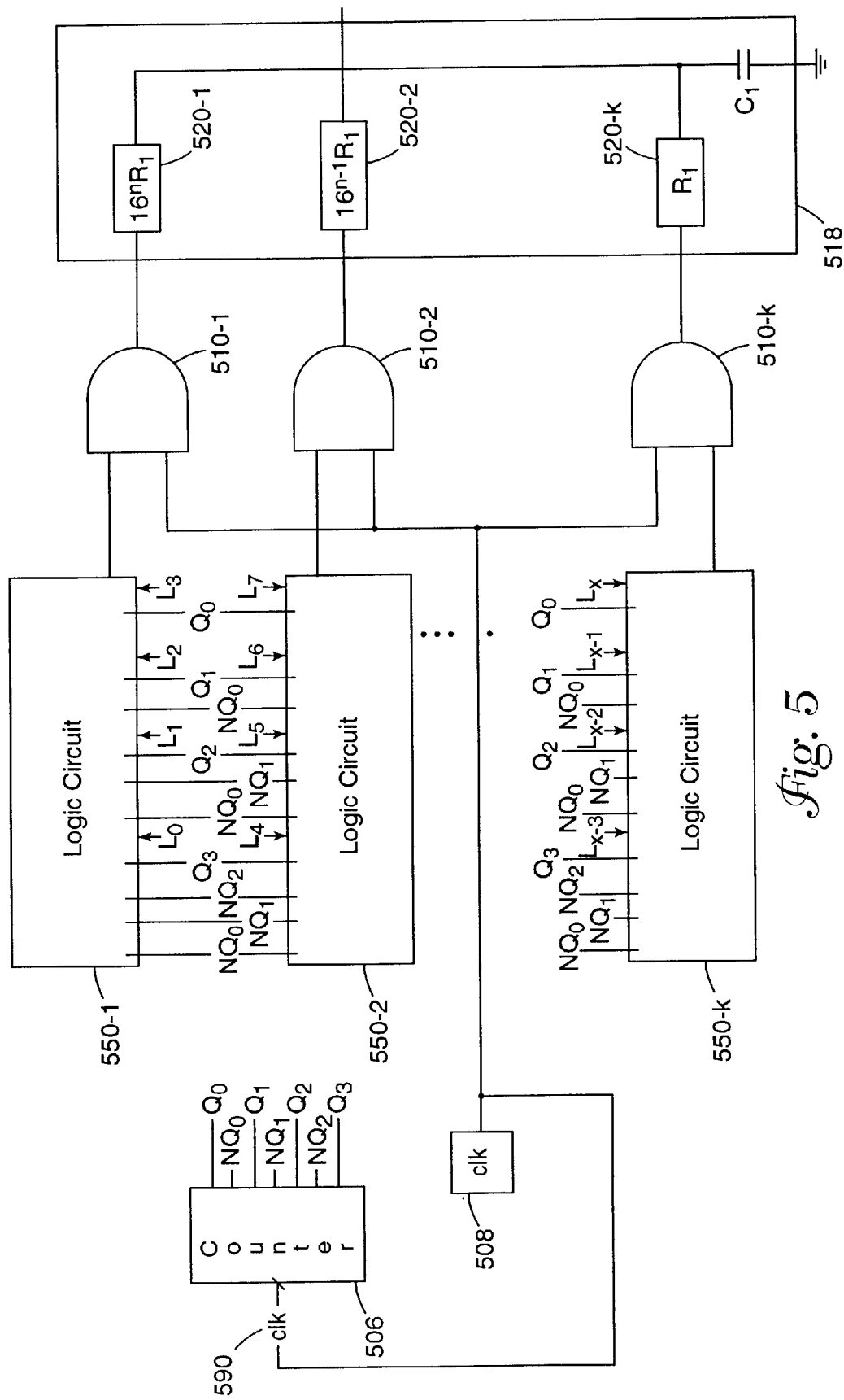
FIG. 5 is a block diagram of another embodiment of a digital to analog converter according to the teachings of this invention.

FIG. 5 is an illustration of another embodiment of a digital to analog converter indicated generally at 500 and constructed according to the teachings of the present invention. DAC 500 includes a plurality of 4-bit logic circuits 550-1 to 550-K. Each logic circuit 550-1 to 550-K includes a plurality of logic gates such as 104 as described with respect to FIG. 1 above. DAC 500 includes a counter 506 having outputs Q0 to Q3 and NQ0 to NQ2 where the NQ outputs are the inverse of the corresponding Q0 output and a clock input 590 (CLK) coupled to clock 508. Logic circuit 550-1 receives up to a 4-bit input L0 to L3, logic circuit 550-1 receives up to a 4-bit input L4 to L7 and logic circuit 550-K receives up to a 4-bit input Lx-3 to Lx (Lx being the most significant bit), x represents the maximum number of bits minus one (Bmax–1). So for a 16 bit input x=(Bmax−1) therefore x=(16−1)=15. DAC 500 is expandable by 4-bit increments. The outputs of logic gates 550-1 to 550-K are input to corresponding AND gates 510-1 to 510-K. AND gates 510-1 to 510-K also receive a clock signal input from clock 508. The outputs of AND gates 510-1 to 510-K are passed through a filter 518 to filter out any spurious signals. Filter 518 includes an output 567 for an analog signal based on a digital input signal via L0 to LX. In one embodiment, filter 518 is a low pass filter. In one embodiment, filter 518 includes a plurality of resistors 520-1 to 520-K coupled in parallel and a capacitor C1 coupled in series with resistors 520-1 to 520-K. Each resistor value is proportional to the next resistor. For example resistor 520-1 is equal to $16^n$ times the value of resistor 520-K, n is equal to (x−3)/4. Resistor 520-2 is equal to $16^{n-1}$ times the value of resistor 520-K. The result is an (x+1)-bit Digital to Analog converter 500 that requires a minimum of two resistors as compared to a conventional DAC that would require a minimum of (x+1)/4 resistors to operate.

It is understood that although DAC 100 described with respect to FIG. 1 is an 8-bit converter and converter 500 described with respect to FIG. 5 is an (x+1)-bit converter the described logic circuit designed may be employed to operate any sized DAC.

Figure 6A:
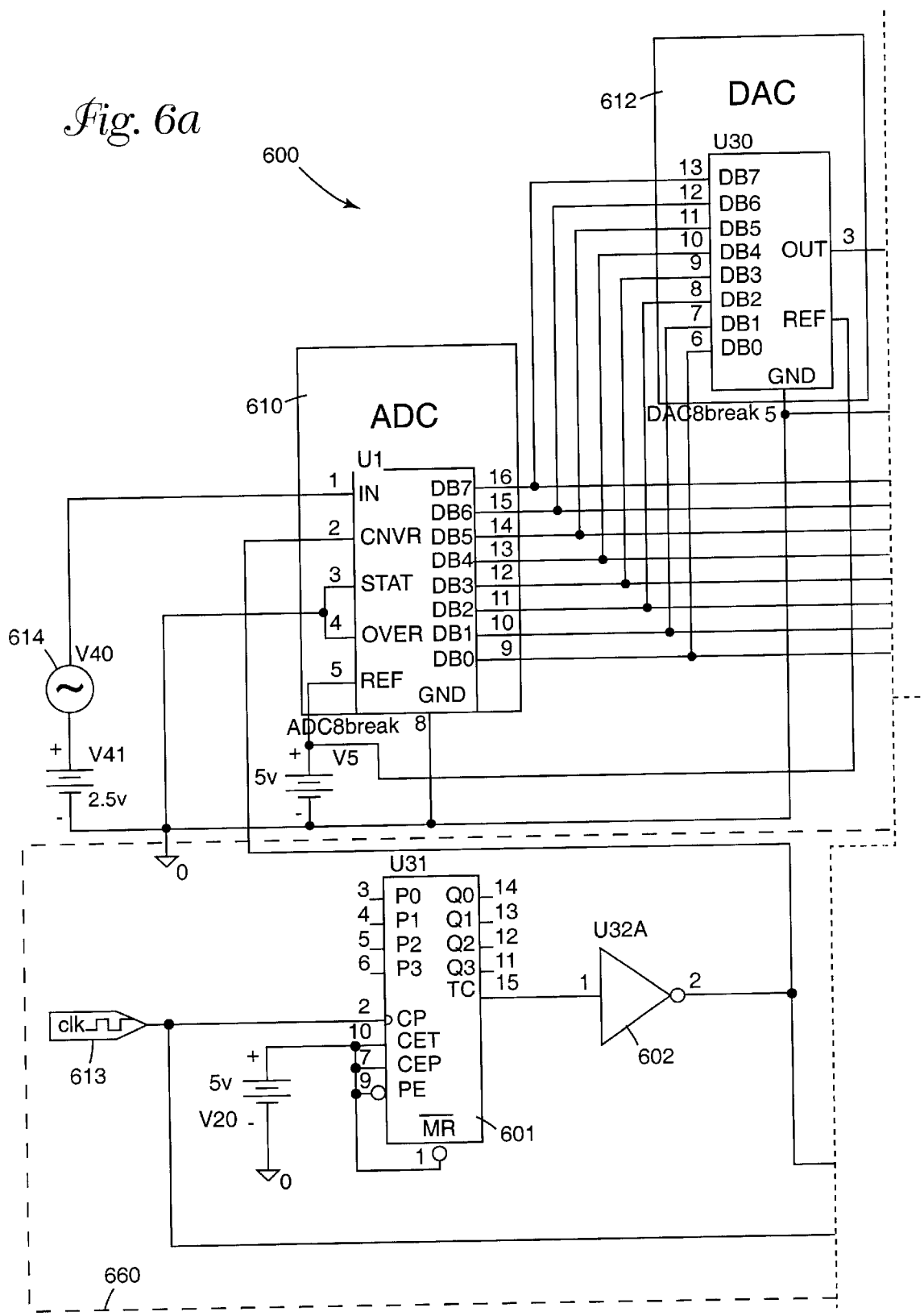
FIGS. 6a, 6b, and 6c are a schematic of one embodiment of a test board having a digital to analog converter constructed according to the teachings of this invention.
Figure 6B:
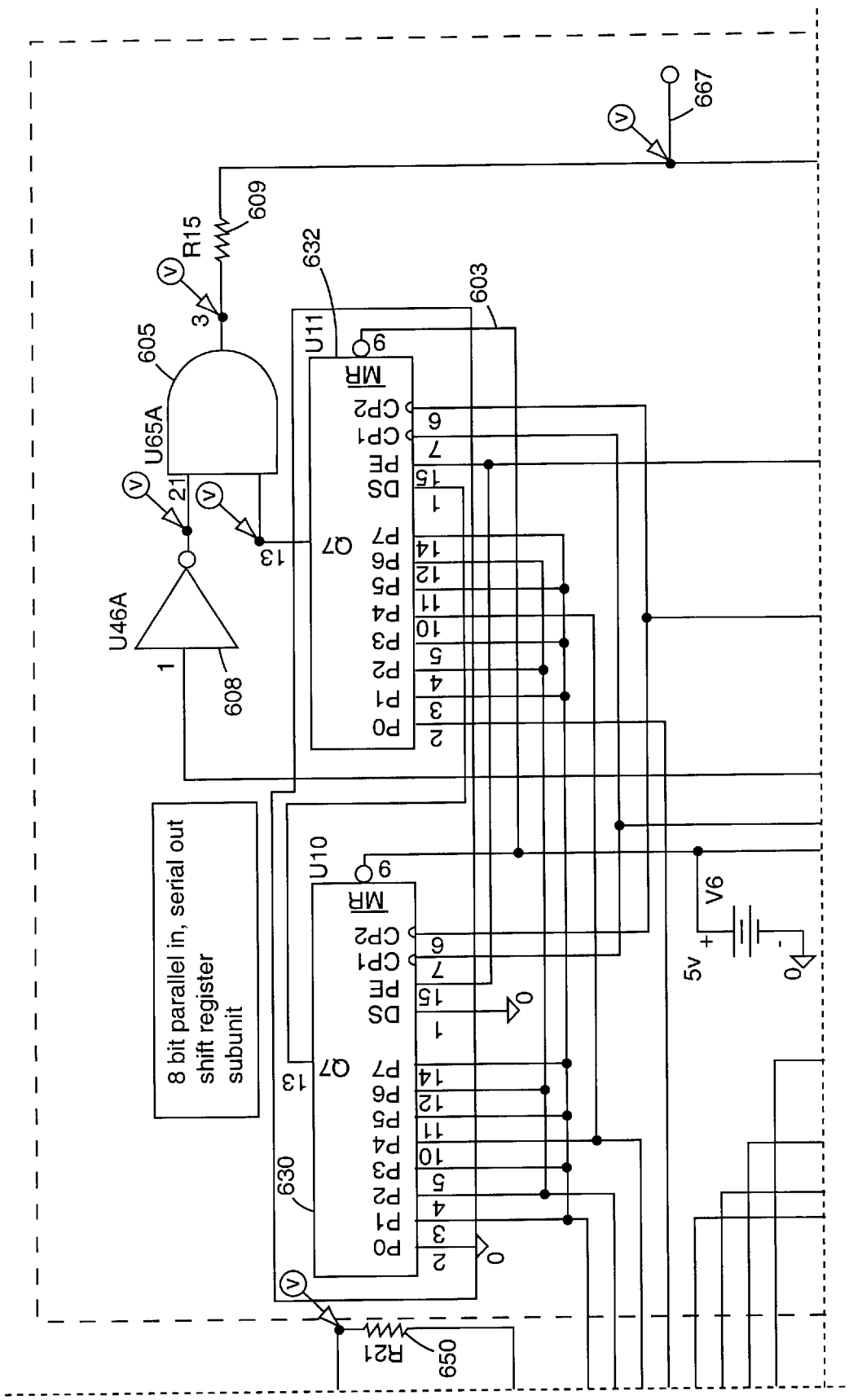
Figure 6C:
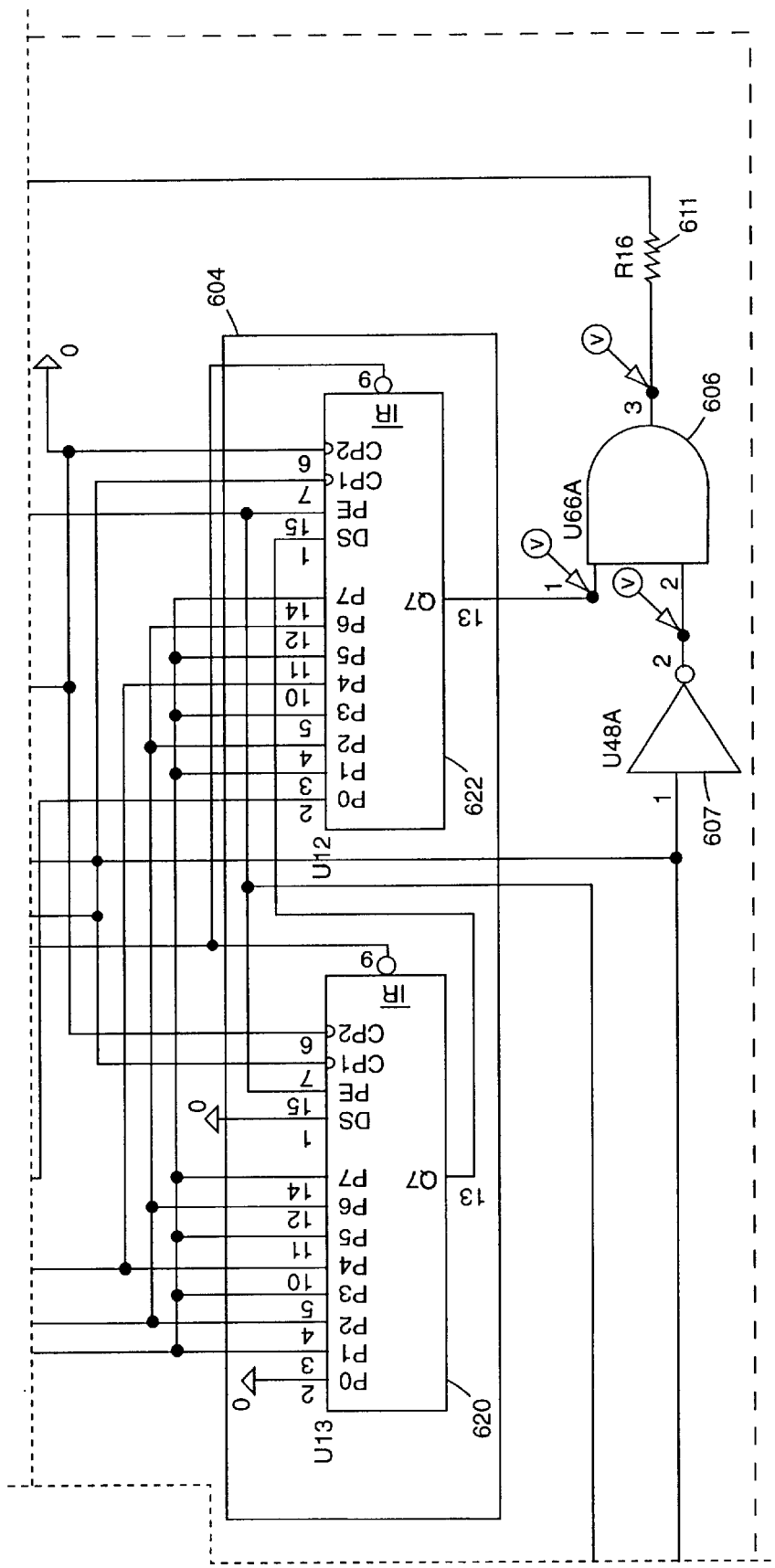

FIGS. 6a, 6b, and 6c show a test board schematic 600 and include another embodiment of a DAC, shown generally at 660 and constructed according to the teachings of this invention. The DAC 660 differs in hardware from DAC 100 shown in FIG. 1, but is functionally equivalent. The DAC 660 under test is implemented by: a 4-bit counter 601, an inverter 602, two 16-bit "parallel in—serial out" registers 603, 604 (each of them is built up from 2 8-bit subunits 630 and 632, and 620 and 622 respectively), two AND gates 605, 606, two clock inverters 607, 608, two resistors 609, 611 and clock source 613.

The following parts are added for testing the quality of a DAC such as 660: an analog signal source 614, an Analog to Digital converter (ADC) 610, a conventional digital to analog converter 612 and resistor 650.

The 4-bit counter 601 has a clock input labeled CP, an overflow output labeled TC. The overflow output TC is activated once per 16 clocks. The CP input of counter 601 is connected to an output of clock source 613 that is in turn connected to inputs of clock inverters 607 and 608, and to clock inputs labeled CP1 of both subunits 630 and 632, and 620 and 622 of 16-bit registers 603 and 604, respectively. The TC output of counter 601 is connected to an input of inverter 602. An output of inverter 602 is connected to a start command input (CNVRT) of the ADC 610 and to store command inputs PE both subunits 630 and 632 and 620 and 622 of 16-bit registers 603 and 604, respectively. This allows registers 603 and 604 to store the resent output code of ADC 610 while ADC 610 starts to prepare the next output code.

Four most significant bits DB7, DB6, DB5 and DB4 of the output of ADC 610 are connected to 15 of the total 16 parallel inputs P7–P0 of sub-unit 630 and 632 of the 6-bit register 603 in the following manner"

DB7 to P7, P5, P3, P1 of sub-unit 630 and P7, P5, P3, P1 of sub-unit 632; corresponding 8-bits in sub-units 630 and 632 will store the DB7 value;

DB6 to P6, P2 of sub-unit 630 and P6, P2 of sub-unit 632; corresponding 4-bits in sub-units 630 and 632 will store the DB6 value;

DB5 to P4 of sub-unit 630 and P4 of sub-unit 632; corresponding 2-bits in sub-units 630 and 632 will store the DB5 value;

DB4 to P0 of sub-unit 632 only; corresponding 1 bit in sub-unit 632 will store the D4 value. Logic low to P0 of sub-unit 630 is connected to ground.

Four less significant bits DB3, DB2, DB1, DB0 of the output of ADC 610 are connected to 15 of total 16 parallel inputs P7 . . . P0 of sub-unit 620 and P7 . . . P0 of sub-unit 622 of the 16-bit register 604 in the following manner:

DB3 to P7, P5, P3, P1 of sub-unit 620 and P7, P5, P3, P1 of sub-unit 622; corresponding 8-bits in sub-units 620 and 622 will store the DB3 value;

DB2 to P6, P2 of sub-unit 620 and P6, P2 of sub-unit 622; corresponding 4-bits in sub-units 620 and 622 will store the DB2 value;

DB1 to P4 of sub-unit 620 and P4 of sub-unit 622; corresponding 2-bits in sub-units 620 and 622 will store the DB1 value;

DB0 to P0 of sub-unit 622 only; corresponding 1 bit in sub-unit 622 will store the DB0 value. Logic low to P0 of sub-unit 620 is connected to ground.

As the store command PE of register 603 goes high, the output labeled Q7 of sub-unit 632 reflects the value stored from P7 of sub-unit 632. Immediately after the store command PE goes low, the register 603 on each clock pulse CP1 shifts the stored values right, in turn bringing to output Q7 of sub-unit 632 values, once stored from P6, P5, . . . P0 of sub-unit 632 and then P7, P6, . . . P0 of sub-unit 630. This way the entire 16-bits stored in the sub-units 630 and 632 of register 603 will appear in turn on the output Q7 output of sub-unit 632. Due to the connections between the outputs of the ADC 610-DB7, DB6, DB5, DB4 and the register 603 parallel inputs P7 . . . P0 (sub-unit 630), P7 . . . P0 (sub-unit 632) as described above, the high level on DB7 stored to 8 bits—P7, P5, P3, P1 of sub-unit 630 and P7, P5, P3, P1 of sub-unit 632 will result in 8 high level pulses on the register on output Q7 of sub-unit 632. Similarly, the DB6 high value will be reflected by 4 high level pulses on output Q7 of sub-unit 632, the DB5 high value will result in 2 high level pulses on output Q7 of sub-unit 632, the DB4 high value will result in 1 high level pulse on output Q7 of sub-unit 632. All together in each period of 16 clock pulses there will be between 0 and 15 high level pulses on output Q7 of sub-unit 632; the total width of the high level pulses being proportional to the number from 0 to 15, binary represented by four most significant bits DB7 . . . DB4 of ADC 610 output code.

Register 604 operates in the same way as register 603 with output on Q7 of sub-unit 622. The total width of the high level pulses on output Q7 of sub-unit 633 is proportional to the number from 0 to 15, binary represented by 4 less significant ADC 610 output bits (DB3 . . . DB0).

Output Q7 of sub-unit 632 is connected to one of AND gate 605 inputs, the second input of AND gate 605 is connected to the clock inverter 608 output. This connection allows minimized pulse-to-pulse interaction that in turn allows for low frequency noise reduction. The output of AND gate 605 is connected to the final converter output 667 via resistor 609.

In the same manner, output Q7 of sub-unit 622 is connected to one of AND gate 606 inputs, the second input of AND gate 606 is connected to the clock inverter 607 output. This connection allows minimized pulse-to-pulse interaction, which in turn allows for low frequency noise reduction. The output of AND gate 606 is connected to the final converter output 667 via resistor 611.

The resistance values for 609 and 611 relate as 1:16, thus accounting for the 16:1 weights difference between the 4 most significant bits of ADC 610 output (DB7–DB4) and the 4 less significant bits of ADC 610 output (DB3–DB0).

To check the proposed converter quality, a reference analog voltage source 614 (2.5 V sine wave plus 2.5 V DC offset) is connected to the ADC 610 input (CNVRT), and 8 inputs DB7 . . . DB0 of a conventional reference DAC 612 are connected to the 8 ADC 610 outputs DB7 . . . DB0. Test board schematic 600 has been simulated using PSpice simulation. PSpice is an industry standard program that allows you to perform computer simulations of electronic circuits The simulation results are shown in two graphs on FIG. 3. The first graph, marked by rectangles, shows the log power spectrum of the reference DAC 612, the second graph, marked by diamonds, reflects the log power spectrum of the output 667 of proposed converter 660. As it's seen, for frequencies below 0.4 MHz both reference and proposed converters have about 60 dB of spurious free dynamic range, and for higher frequencies the proposed converter leaves only about 48 dB free of spurious. This shows the advantage in moving the noise to high frequencies.

The hardware performance of converters 100, 500 and 660 depends first of all on the accuracy of the resistors 120 and 122, 520-1 . . . 520-k, 609 and 611, respectively. The absolute values of these resistors are less important as the linearity depends on the relative values—R120/R122, R520-1/R520-2 . . . , R520-k-1/R520-k and R609/R611. The coarse tuning of these relative values is provided by the resistor design, e.g. by buying or building 8 equal resistors having a value R and connecting 4 of them serially to get R120=4R, another 4 in parallel to get R122=R/4. Finally R120/R122=4R/(R/4)=16. For fine tuning, for example, converter 100 will be forced to run on three input code sets:

0000 0000 in L7 . . . L0, the corresponding output 107 voltage U0 is measured;

0000 1111 in L7 . . . L0, the corresponding output 107 voltage U15 is measured; and 0001 0000 in L7 . . . L0, the corresponding output 107 voltage U16 is measured.

The sign of the equation: $\{(U16-U0)/(U15-U0)-16/15\}$ indicates, which of R120 or R122 has to be increased (alternatively which of R122, R120 has to be decreased). A 1% mismatch in the R122/R120 relative value will result in peak error of approximately 0.16 of the least significant bit and a root mean square error of approximately 0.05 of least significant bit, that being more than acceptable.

CONCLUSION

In one embodiment, a digital to analog converter has been described. The converter includes a multi-bit counter and a first and a second plurality of logic gates coupled to the multi-bit counter. The converter further includes a digital input selectively coupled to the first and second plurality of logic gates a first AND gate coupled to an output of the first plurality of logic gates and a second AND gate coupled to an output of the second plurality of logic gates. In addition, the converter includes a clock coupled to an input of the first and second AND gates and a filter coupled to an output of the first and second AND gates. The filter includes an output for an analog signal based on the digital input.

In another embodiment, a method of converting a multi-bit digital input signal to an analog signal has been described. The method includes receiving a digital number and converting the digital number to a series of pulses. The method further includes summing the series of pulses. The pulses in a predetermined period represent the received digital number. In addition, the method includes applying a clock signal to the sum of the series of pulses to obtain an analog signal that represents the digital number.

Although specific embodiments have been illustrated and described herein, it will be appreciated by those of ordinary skill in the art that any arrangement, which is calculated to achieve the same purpose, may be substituted for the specific embodiments shown. For example, in one embodiment, the digital to analog converter may be expanded from an 8-bit DAC to an n-bit DAC by increasing the size of the multi-bit counter and adding AND gates to the first and second plurality of logic gates using the same logic scheme as used in the 8-bit DAC. To increase the 8-bit DAC to a 12-bit converter the multi-bit counter would be increased to a 6-bit counter and the first and second plurality of logic circuits would each include 2 additional AND gates. This application is intended to cover any adaptations or variations of the present invention. Therefore, it is intended that this invention be limited only by the claims and the equivalents thereof.

What is claimed is:

1. A digital to analog converter, comprising:

a multi-bit counter;

a first and a second plurality of logic gates coupled to the multi-bit counter;

a digital input selectively coupled to the first and second plurality of logic gates;

a first AND gate coupled to an output of the first plurality of logic gates;

a second AND gate coupled to an output of the second plurality of logic gates;

a clock coupled to an input of the first and second AND gates and an input of the multi-bit counter; and a filter coupled to an output of the first and second AND gates, wherein the filter includes an output for an analog signal based on the digital input.

2. The converter of claim 1, wherein the first and second plurality of logic gates are logically identical.

3. The converter of claim 1, wherein the first plurality of logic gates comprises one or more AND gates that are adapted to produce pulses based on the digital input, wherein none of the pulses overlap in time.

4. The converter of claim 3, wherein the frequency of the pulses is based on the frequency of each bit of the multi-bit counter.

5. The converter of claim 1, wherein the second plurality of logic gates comprises one or more AND gates that are adapted to produce pulses based on the digital input, wherein none of the pulses overlap in time.

6. The converter of claim 5, wherein the frequency of the pulses is based on the frequency of each bit of the multi-bit counter.

7. The converter of claim 3, wherein the first plurality of logic gates further comprises an OR gate coupled to the one or more AND gates and sums the outputs of the one or more AND gates for input to the first AND gate.

8. The converter of claim 5, wherein the second plurality of logic gates further comprises an OR gate coupled to the one or more AND gates and sums the outputs of the one or more AND gates for input to the second AND gate.

9. The converter of claim 1, wherein the filter comprises:

a first and second resistor in parallel; and a capacitor coupled in series with the first and second resistors.

10. The converter of claim 9, wherein the value of the first resistor is sixteen times the value of the second resistor.

11. The converter of claim 1, wherein the first and second plurality of logic gates comprises AND and OR logic gates.

12. The converter of claim 1, wherein the multi-bit counter is a four-bit counter.

13. The converter of claim 1, wherein the filter comprises a low pass filter.

14. A digital to analog converter, comprising:

a multi-bit counter;

a first plurality of AND logic gates coupled to the multi-bit counter;

a second plurality of AND logic gates coupled to the multi-bit counter;

a digital input selectively coupled to the first and second plurality of AND logic gates;

a first OR logic gate coupled to an output of the first plurality of AND logic gates;

a second OR logic gate coupled to an output of the second plurality of AND logic gates;

a first AND logic gate coupled to an output of the first OR logic gate;

a second AND logic gate coupled to an output of the second OR logic gate;

a clock coupled to an input of the first and second AND logic gates and an input of the multi-bit counter;

a filter coupled to an output of the first and second AND logic gates; and an analog output coupled to the filter, wherein the analog output is based on the digital input.

15. The converter of claim 14, wherein the first and second plurality of AND logic gates are logically identical.

16. The converter of claim 14, wherein the first plurality of AND logic gates are adapted to produce pulses based on the digital input, wherein none of the pulses overlap in time.

17. The converter of claim 16, wherein the frequency of the pulses is based on the frequency of each bit of the multi-bit counter.

18. The converter of claim 14, wherein the second plurality of AND logic gates are adapted to produce pulses based on the digital input, wherein none of the pulses overlap in time.

19. The converter of claim 18, wherein the frequency of the pulses is based on the frequency of each bit of the multi-bit counter.

20. The converter of claim 16, wherein the first OR logic gate sums the outputs of the first plurality of AND logic gates for input to the first AND logic gate.

21. The converter of claim 18, wherein the second OR logic gate sums the outputs of the second plurality of AND logic gates for input to the second AND logic gate.

22. The converter of claim 14, wherein the filter comprises:

a first resistor coupled to an output of the first AND logic gate;

a second resistor coupled to an output of the second AND logic gate; and a capacitor coupled to the first and second resistors.

23. The converter of claim 14, wherein the multi-bit counter is a four-bit counter.

24. The converter of claim 14, wherein the first resistor is sixteen times the value of the second resistor.

25. A method of converting a multi-bit digital input signal to an analog signal, the method comprising:

receiving a digital number;

converting the digital number to a series of pulses;

summing the series of pulses, wherein the pulses in a predetermined period represents the received digital number; and applying a clock signal to the sum of the series of pulses to obtain an analog signal that represents the digital number.

26. The method of claim 25, further comprising filtering out high frequency harmonics associated with the analog signal.

27. The method of claim 25, wherein summing the series of pulses comprises summing the series of pulses wherein the width of the pulses in a predetermined period represents the received digital number.

28. The method of claim 25, wherein converting the digital number to a series of pulses comprises converting the digital number to a first and a second series of pulses wherein the pulses of the first series do not overlap in time and the pulses of the second series do not overlap in time.

29. The method of claim 25, wherein converting the digital number to a series of pulses comprises converting the digital number to a series of pulses based on the frequency of each bit of a multi-bit counter.

30. The method of claim 25, wherein converting the digital number to a series of pulses comprises:
generating pulse trains of varying frequency; and
selecting pulses for the pulse trains based on the digital number, wherein the selected pulses do not overlap in time.

31. The method of claim 25, wherein receiving a digital number comprises receiving an 8-bit digital number.

32. The method of claim 25, wherein the frequency of the clock signal determines the level of tuning of the represented signal.

33. A digital to analog converter, comprising:
a multi-bit counter;
a plurality of logic circuits coupled to the multi-bit counter;
a digital input selectively coupled to the plurality of logic circuits;
a plurality of AND gates, each AND gate coupled to an output of one of the plurality of logic circuits;
a clock signal coupled to an input of each of the plurality of AND gates; and
a filter coupled to an output of each of the plurality of AND gates, wherein the filter includes an output for an analog signal based on the digital input.

34. The converter of claim 33, wherein the filter comprises:
a plurality of resistors coupled in parallel, wherein one of the plurality of resistors is coupled to an output of one of the plurality of AND gates; and
a capacitor coupled in series with the plurality of resistors.

35. The converter of claim 34, wherein the value of each of the plurality of resistors is proportional to the value of each other based on the maximum number of bits being converted.

36. The converter of claim 33, wherein each of the plurality of logic gates comprises comprise AND and OR logic gates.

37. The converter of claim 33, wherein the multi-bit counter is a four-bit counter.

38. The converter of claim 33, wherein the filter comprises a low-pass filter.

39. The converter of claim 33, wherein the plurality of logic circuits are logically identical.

40. The converter of claim 33, wherein at least one of the plurality of logic circuits includes one or more AND gates that are adapted to produce pulses based on the digital input, wherein none of the pulses overlap in time.

41. The converter of claim 40, wherein the frequency of the pulses is based on the frequency of each bit of the multi-bit counter.

42. The converter of claim 40, wherein the at least one logic circuit includes an OR logic gate that sums the outputs of the one or more AND gates for input to an associated AND gate.

43. A multi-bit digital to analog converter, comprising:
a multi-bit counter;
a clock coupled to an input of the multi-bit counter;
an inverter coupled to an output of the multi-bit counter;
a first and a second parallel-in, serial-out shift register each coupled to an output of the multi-bit counter;
a digital input selectively coupled to the first and second shift registers;
a first clock inverter coupled to an output of the clock;
a second clock inverter coupled to an output of the clock;
a first AND gate coupled to an output of the first clock inverter and an output of the first shift register;
a second AND gate coupled to an output of the second clock inverter and the second shift register;
a first resistor coupled to an output of the first AND gate;
a second resistor coupled to an output of the second AND gate;
wherein the first and second resistors are coupled to an analog output that is based on the digital input.

44. The converter of claim 43, wherein the first and second shift registers are identical.

45. The converter of claim 43, wherein the first and second shift registers produce pulses based on the digital input, wherein none of the pulses overlap in time.

46. The converter of claim 45, wherein the frequency of the pulses is based on the frequency of each bit of the multi-bit counter.

47. The converter of claim 43, wherein the value of the second resistor is sixteen times the value of the first resistor.

48. The converter of claim 43, wherein the multi-bit counter is a four-bit counter.

49. The converter of claim 43, wherein the first and second shift registers comprise first and second 16-bit parallel-in, serial-out shift registers.

50. The converter of claim 49, wherein the first and second 16-parallel-in, serial-out shift registers each comprise two 8-bit parallel-in serial-out shift registers.

51. A method of testing a multi-bit digital to analog converter, the method comprising:
generating an 8-bit digital number using the four most significant bits and four least significant bits of an analog to digital converter output;
applying the four most significant bits to a plurality of inputs of a first 16-bit parallel-in, serial-out shift register;
applying the four least significant bits to a plurality of inputs of a second 16-bit parallel-in, serial-out shift register;
converting the four most significant bits to a first series of pulses;
converting the four least significant bits to a second series of pulses;
summing the first series of pulses, wherein the first series of pulses represents the digital equivalent of the 4 most significant bits received;
summing the second series of pulses, wherein the second series of pulses represents the digital equivalent of the 4 least significant bits received;
applying a clock signal to the sum of the first series of pulses to obtain an first analog signal that represents the digital equivalent of the 4 most significant bits;
applying the clock signal to the sum of the second series of pulses to obtain a second analog signal that represents the digital equivalent of the 4 least significant bits;
combining the first and second analog signals so as to produce a third analog signal that represents the 8-bit digital number; and
comparing the third analog output to an output of an 8-bit digital to analog converter.

52. The method of claim 51, wherein summing the first series of pulses comprises summing the first series of pulses wherein the width of the pulses in a predetermined period represents the digital equivalent of the 4-most significant bits.

53. The method of claim 52, wherein summing the second series of pulses comprises summing the second series of pulses wherein the width of the pulses in a predetermined period represents the digital equivalent of the 4-least significant bits.

54. The method of claim 51, wherein converting the digital number to a series of pulses comprises converting the digital number to a first and a second series of pulses wherein the pulses of the first series do not overlap in time and the pulses of the second series do not overlap in time.

55. The method of claim 51, wherein converting the four most significant bits to a first series of pulses comprises converting the four most significant bits to a first series of pulses based on the frequency of each bit of a multi-bit counter.

* * * * *